(12) United States Patent
Harjono et al.

(10) Patent No.: US 10,422,818 B2
(45) Date of Patent: Sep. 24, 2019

(54) POWER TRANSISTORS WITH A RESISTOR COUPLED TO A SENSE TRANSISTOR

(71) Applicant: TEXAS INSTRUMENTS INCORPORATED, Dallas, TX (US)

(72) Inventors: Tikno Harjono, Cupertino, CA (US); Vijay Krishnamurthy, Santa Clara, CA (US); Min Chu, Plano, TX (US); Kuntal Joardar, Plano, TX (US); Gary Eugene Daum, Orwigsburg, PA (US); Subrato Roy, Bangalore (IN); Vinayak Hegde, Honnavar (IN); Ankur Chauhan, Bangalore (IN); Sathish Vallamkonda, Murphy, TX (US); Md Abidur Rahman, Richardson, TX (US); Eung Jung Kim, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/859,470

(22) Filed: Dec. 30, 2017

(65) Prior Publication Data

US 2019/0204361 A1 Jul. 4, 2019

(51) Int. Cl.
| | | |
|---|---|---|
| *G01R 15/14* | (2006.01) | |
| *H01L 27/06* | (2006.01) | |
| *H03K 17/567* | (2006.01) | |
| *H01L 25/18* | (2006.01) | |
| *H01L 49/02* | (2006.01) | |

(52) U.S. Cl.
CPC ............ *G01R 15/146* (2013.01); *H01L 25/18* (2013.01); *H01L 27/0629* (2013.01); *H01L 28/20* (2013.01); *H03K 17/567* (2013.01)

(58) Field of Classification Search
CPC .................................................. G01R 19/0092
See application file for complete search history.

(56) References Cited

U.S. PATENT DOCUMENTS

| | | | | |
|---|---|---|---|---|
| 2006/0091961 | A1* | 5/2006 | Briskin | .................. H03F 1/523 330/298 |
| 2007/0242526 | A1* | 10/2007 | Morikado | ............ G11C 7/1015 365/210.14 |
| 2008/0315853 | A1* | 12/2008 | Capilla | ............... H02M 3/1588 323/288 |
| 2010/0025744 | A1* | 2/2010 | Miyashita | ......... H01L 21/26506 257/288 |
| 2010/0194462 | A1* | 8/2010 | Petruzzi | ............. H03K 17/0822 327/427 |

(Continued)

*Primary Examiner* — Adam D Houston
(74) *Attorney, Agent, or Firm* — Rose Alyssa Keagy; Charles A. Brill; Frank D. Cimino

(57) ABSTRACT

An electronic device comprises: a first semiconductor die; a power transistor integrated in the first semiconductor die, the power transistor comprising a gate, a first terminal, and a second terminal; a sense transistor integrated in the first semiconductor die, the sense transistor comprising a gate coupled to the gate of the power transistor, a first terminal, and a second terminal coupled to the second terminal of the power transistor; and a first resistor integrated in the first semiconductor die, the first resistor comprising a polysilicon section and a metal section coupled to the polysilicon section, the first resistor comprising a first terminal and a second terminal, wherein the first terminal of the first resistor is coupled to the first terminal of the sense transistor.

19 Claims, 5 Drawing Sheets

(56) References Cited

U.S. PATENT DOCUMENTS

| | | | |
|---|---|---|---|
| 2012/0194161 A1* | 8/2012 | Latham, II | H02M 3/156 |
| | | | 323/286 |
| 2013/0181723 A1* | 7/2013 | Mauder | G01R 19/0092 |
| | | | 324/601 |
| 2013/0249421 A1* | 9/2013 | Cavallini | H05B 33/0842 |
| | | | 315/193 |
| 2015/0099341 A1* | 4/2015 | Gruber | H01L 28/20 |
| | | | 438/382 |
| 2015/0318389 A1* | 11/2015 | Tsuchiya | H01L 29/7813 |
| | | | 257/77 |
| 2015/0341029 A1* | 11/2015 | Franchini | H01L 21/823418 |
| | | | 327/434 |
| 2016/0087622 A1* | 3/2016 | Kaeriyama | H03K 17/0828 |
| | | | 327/109 |
| 2016/0178670 A1* | 6/2016 | Bernacchia | H01L 29/7815 |
| | | | 324/76.11 |
| 2016/0313378 A1* | 10/2016 | Duvjnak | G01R 19/10 |
| 2018/0123578 A1* | 5/2018 | Chauhan | G01R 19/0092 |

* cited by examiner

POWER TRANSISTORS WITH A RESISTOR COUPLED TO A SENSE TRANSISTOR

BACKGROUND

In many power circuits, a power transistor provides a drain-source current to a load, where a sense transistor is coupled to the power transistor to indirectly measure the drain-source current. When the power transistor is turned on, the sense transistor has a drain-source current indicative of the power transistor drain-source current, but with a much smaller magnitude. By measuring the drain-source current of the sense transistor, an indirect measurement can be made of the much larger drain-source current of the power transistor.

SUMMARY

In accordance with a first set of embodiments, an electronic device comprises: a first semiconductor die; a power transistor integrated in the first semiconductor die, the power transistor comprising a gate, a first terminal, and a second terminal; a sense transistor integrated in the first semiconductor die, the sense transistor comprising a gate coupled to the gate of the power transistor, a first terminal, and a second terminal coupled to the second terminal of the power transistor; and a first resistor integrated in the first semiconductor die, the first resistor comprising a polysilicon section and a metal section coupled to the polysilicon section, the first resistor comprising a first terminal and a second terminal, wherein the first terminal of the first resistor is coupled to the first terminal of the sense transistor.

In accordance with the first set of embodiments, in the electronic device, the first terminal of the power transistor is a source of the power transistor, the second terminal of the power transistor is a drain of the power transistor, the first terminal of the sense transistor is a source of the sense transistor, and the second terminal of the sense transistor is a drain of the power transistor.

In accordance with the first set of embodiments, in the electronic device, the power and sense transistors are each n-metal-oxide-semiconductor field-effect-transistors (nMOSFETs).

In accordance with the first set of embodiments, in the electronic device, the power and sense transistors are each p-metal-oxide-semiconductor field-effect-transistors (pMOSFETs).

In accordance with the first set of embodiments, in the electronic device, the first terminal of the power transistor is a drain of the power transistor, the second terminal of the power transistor is a source of the power transistor, the first terminal of the sense transistor is a drain of the sense transistor, and the second terminal of the sense transistor is a source of the power transistor.

In accordance with the first set of embodiments, in the electronic device, the power transistor has a channel resistance and parasitic resistances, the sense transistor has a channel resistance, and the first resistor has a resistance matching the parasitic resistances multiplied by a ratio of the sense transistor channel resistance to the power transistor channel resistance.

In accordance with the first set of embodiments, the electronic device further comprises a controller, the controller comprising: a first node coupled to the second terminal of the first resistor; and a second node coupled to first terminal of the power transistor.

In accordance with the first set of embodiments, the electronic device further comprises a second semiconductor die, wherein the controller is integrated in the second semiconductor die.

In accordance with the first set of embodiments, in the electronic device, the controller to provide a virtual connection from the second terminal of the first resistor to the first terminal of the power transistor.

In accordance with the first set of embodiments, in the electronic device, the controller to maintain a first voltage at the first node to equal a second voltage at the second node.

In accordance with the first set of embodiments, in the electronic device, the controller further comprises: an operational amplifier comprising a first input port coupled to the first terminal of the power transistor, a second input port coupled to the first resistor, and an output port; and a pass transistor having a gate coupled to the output port of the operational amplifier, and a drain coupled to the first resistor.

In accordance with the first set of embodiments, in the electronic device, the controller further comprises: a second resistor comprising a first terminal coupled to the first node of the controller, and a second terminal; the controller to provide a virtual connection from the second terminal of the second resistor to the first terminal of the power transistor.

In accordance with the first set of embodiments, in the electronic device, the controller further comprises: a second resistor comprising a first terminal coupled to the first node of the controller, and a second terminal; the controller to maintain a first voltage at the second terminal of the second resistor to equal a second voltage at the second node.

In accordance with the first set of embodiments, in the electronic device, the controller further comprises: a second resistor comprising a first terminal coupled to the first node of the controller, and a second terminal; an operational amplifier comprising a first input port coupled to the source of the power transistor, a second input port coupled to the second resistor, and an output port; and a pass transistor having a gate coupled to the output port of the operational amplifier, and a drain coupled to the second resistor.

In accordance with the first set of embodiments, in the electronic device, the controller further comprises: a second resistor comprising a first terminal coupled to the first node of the controller, and a second terminal; wherein the power transistor has a channel resistance and parasitic resistances, wherein the sense transistor has a channel resistance, and wherein the first resistor has a first resistance and the second resistor has a second resistance, wherein a sum of the first and second resistances match the parasitic resistances multiplied by a ratio of the sense transistor channel resistance to the power transistor channel resistance.

In accordance with the first set of embodiments, in the electronic device, the controller further comprises: a second resistor comprising a first terminal coupled to the first node of the controller, and a second terminal; and a memory to store programming bits to program a resistance value of the second resistor.

In accordance with a second set of embodiments, an electronic device comprises: a semiconductor die comprising a drain region; a power transistor integrated in the semiconductor die, the power transistor comprising a gate and a source; a sense transistor integrated in the semiconductor die, the sense transistor comprising a gate coupled to the gate of the power transistor, and a source, wherein the power and sense transistors share the drain region; and a resistor integrated in the semiconductor die, the resistor comprising a polysilicon section and a metal section coupled to the polysilicon section, the resistor coupled to the source of the sense transistor.

In accordance with a third set of embodiments, an electronic device comprises: a semiconductor die comprising a source region; a power transistor integrated in the semiconductor die, the power transistor comprising a gate and a drain; a sense transistor integrated in the semiconductor die, the sense transistor comprising a gate coupled to the gate of the power transistor, and a drain, wherein the power and sense transistors share the source region; and a resistor integrated in the semiconductor die, the resistor comprising a polysilicon section and a metal section coupled to the polysilicon section, the resistor coupled to the drain of the sense transistor.

BRIEF DESCRIPTION OF THE DRAWINGS

For a detailed description of various examples, reference will now be made to the accompanying drawings in which.

DETAILED DESCRIPTION

Figure 1:
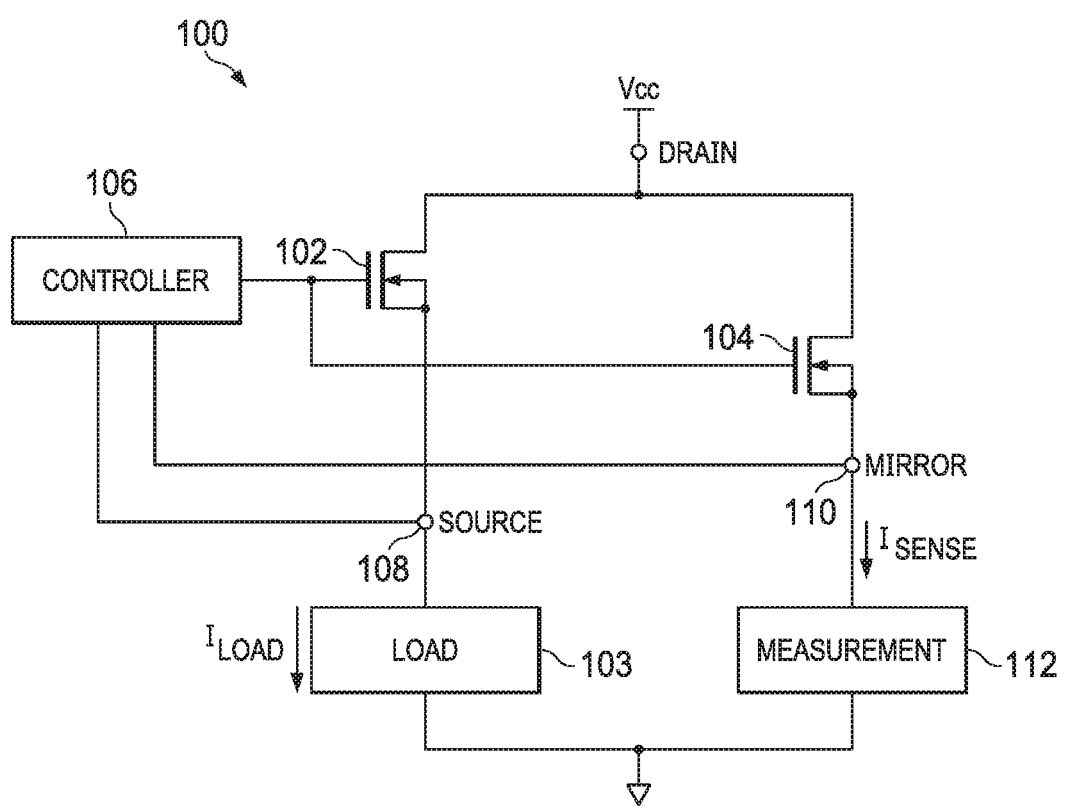
FIG. 1 shows a conventional circuit comprising a power transistor and a sense transistor.

FIG. 1 shows a conventional circuit 100 comprising a power transistor 102 and a sense transistor 104. The power transistor 102 provides a load current $I_{LOAD}$ to a load 103. The gates of the power transistor 102 and the sense transistor 104 are coupled together and controlled by a controller 106. The controller 106 sets the bias on the source 110 of the sense transistor 104 to be equal to the bias on the source 108 of the power transistor 102. The sense transistor 104 is sometimes referred to as a mirror.

The sense transistor 104 is much smaller in size (i.e., a smaller channel width) than the power transistor 102. Ideally, the drain-source current of the sense transistor 104, referred to as a sense current, is related to the drain-source current of the power transistor 102 by a multiplicative factor. This multiplicative factor is referred to as the sense ratio. A measurement circuit 112 measures (senses) the sense current, thereby indirectly providing a measurement of the drain-source current of the power transistor 102. Due to the parasitic resistance of the power transistor 102, which can change with temperature, the sense current is not always related to the drain-source current of the power transistor 102 by a constant multiplicative factor. Furthermore, the relationship of the sense current to the drain-source current of the power transistor 102 can vary as a function of the gate-to-source ($V_{GS}$) bias provided to the power transistor 102.

To mitigate the effect of parasitic resistance and gate bias upon the sense ratio for a power circuit comprising a sense transistor and a power transistor, in accordance with the disclosed embodiments, a resistor is connected to the source of the sense transistor. In accordance with some of the disclosed embodiments, the resistor connected to the source of the sense transistor comprises one or more polysilicon sections coupled in series with one or more metal sections.

This resistor can be designed to mitigate the dependency of the sense current upon the power transistor gate bias and temperature fluctuations.

Figure 2:
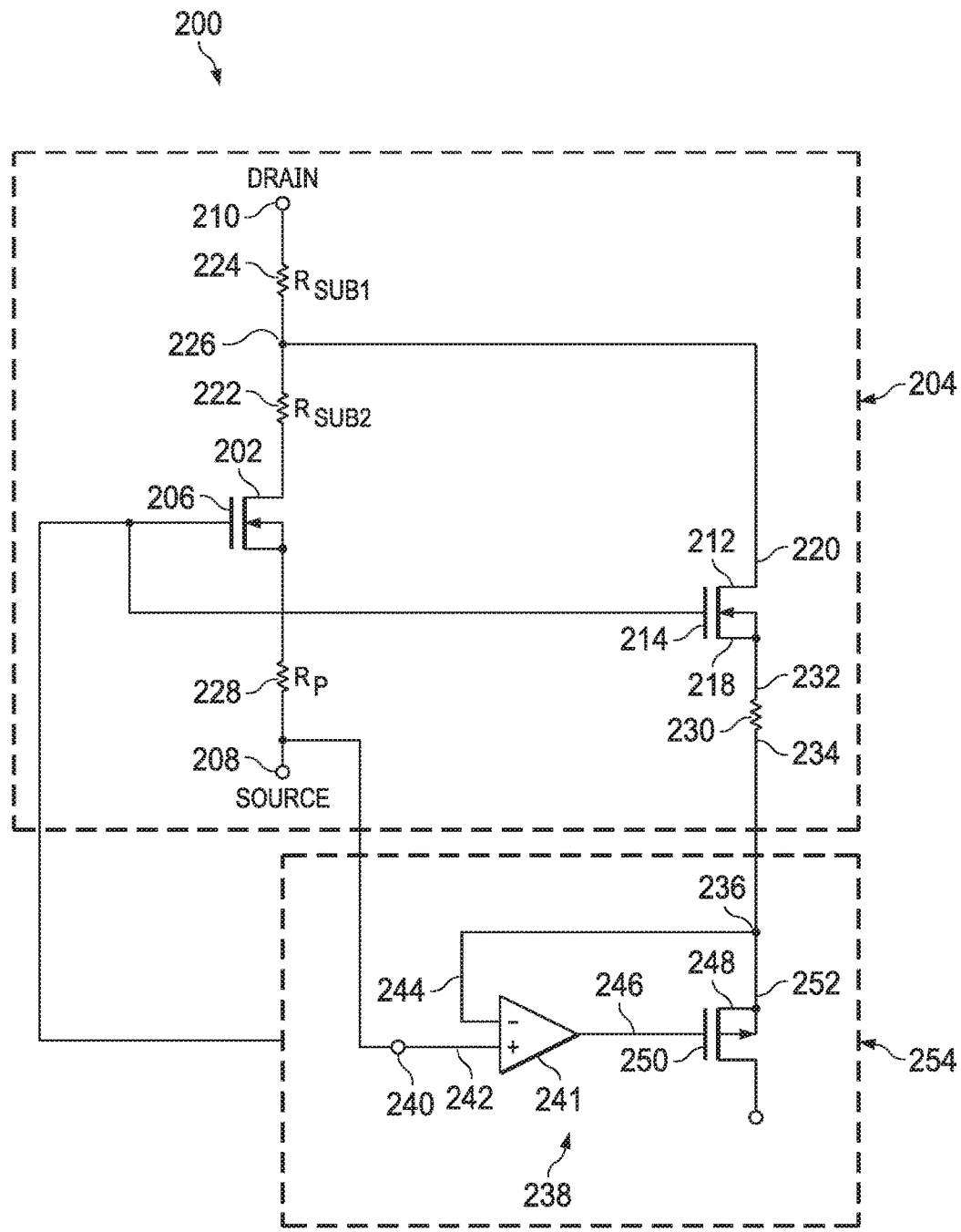
FIG. 2 shows a circuit of an electronic device in accordance with various examples.

FIG. 2 shows a circuit of an illustrative electronic device 200. A power transistor 202 is integrated on a semiconductor die 204, where the power transistor 202 comprises a gate 206, a first terminal 208, and a second terminal 210. In the embodiment of FIG. 2, the power transistor 202 is an n-metal-oxide-semiconductor field-effect-transistor (nMOSFET), the first terminal 208 is a source of the power transistor 202, and the second terminal 210 is a drain of the power transistor 202. Integrated on the semiconductor die 204 with the power transistor 202 is a sense transistor 212. The sense transistor 212 comprises a gate 214 coupled to the gate 206 of the power transistor 202, a first terminal 218, and a second terminal 220 coupled to the second terminal 210 of the power transistor 202. In the embodiment of FIG. 2, the sense transistor 212 is an nMOSFET, the first terminal 218 is a source of the sense transistor 212, and the second terminal 220 is a drain of the sense transistor 212.

In some embodiments, the power transistor 202 comprises a large number (e.g., on the order of 1000) of transistor cells integrated in the semiconductor die 204 and coupled together in parallel so that the power transistor 202 has a relatively large drain-source current when turned on. The sense transistor 212 is fabricated in the same process flow as the power transistor 202, but where the sense transistor 212 is sized much smaller than that of the power transistor 202. In some embodiments, the sense transistor 212 comprises transistor cells integrated in the semiconductor die 204 and coupled together in parallel, but where the parallel-connected transistor cells making up the sense transistor 212 are much smaller in number than the parallel-connected transistor cells making up the power transistor 202. In operation when both the sense transistor 212 and the power transistor 202 are turned on, the drain-source current (i.e., the sense current) of the sense transistor 212 is much smaller than that of the power transistor 202.

In some embodiments, the power transistor 202 and the sense transistor 212 share a region of silicon that forms their second terminals in the semiconductor die 204, effectively coupling together their respective second terminals. This shared region of silicon can be referred to as a drain region in the semiconductor die 204 for embodiments for which the second terminals denote drains of their respective transistors. A resistor 222 and a resistor 224 represent a parasitic (and distributed) resistance of the second terminal 210 of the power transistor 202. Let $R_{SUB1}$ and $R_{SUB2}$ denote, respectively, the resistance contributions of the resistors 224 and 222 to the parasitic resistance of the second terminal 210 of the power transistor 202. The sum of these two parasitic resistances, $R_{SUB1}+R_{SUB2}$, is the total parasitic resistance of the second terminal 210 of the power transistor 202. The circuit of FIG. 2 shows the second terminal 220 of the sense transistor 212 connected to a node 226, indicating that the resistor 224 represents a parasitic resistance $R_{SUB1}$ in common with both the power transistor 202 and the sense transistor 212. A resistor 228 represents a parasitic resistance associated with the first terminal 208 of the power transistor 202.

A resistor 230 has a first terminal 232 coupled to the first terminal 218 of the sense transistor 212, and a second terminal 234 coupled to a first node 236 of a controller 238. The controller 238 includes a second node 240 coupled to the first terminal 208 of the power transistor 202. The controller 238 is coupled to the resistor 230 to provide a virtual connection from the resistor 230 to the first terminal 208 of the power transistor 202. The controller 238 includes an operational amplifier 241 comprising a first input port 242 coupled to the first terminal 208 of the power transistor 202, a second input port 244 coupled to the second terminal 234 of the resistor 230, and an output port 246. The controller further includes a pass transistor 248 having a gate 250 coupled to the output port 246 of the operational amplifier 241, and a source 252 coupled to the second terminal 234 of the resistor 230.

The controller 238 is coupled to the resistor 230 and to the first terminal 208 of the power transistor 202 to maintain a first voltage at the first node 236 to equal a second voltage at the second node 240. The controller 238 causes only a negligible amount of current to flow from the second terminal 234 of the resistor 230 to the first terminal 208 of the power transistor 202, thereby providing a virtual connection between the nodes 236 and 240.

The resistor 230 is integrated on the semiconductor die 204. In some embodiments, the resistor 230 comprises polysilicon coupled to a metal. In some embodiments, the resistor 230 comprises a plurality of polysilicon sections coupled to a plurality of metallic sections. In the particular embodiment illustrated in FIG. 2, the controller 238 is integrated on a second semiconductor die 254. In some embodiments, the controller 238 is integrated on the semiconductor die 204. The controller 238 can include additional circuitry to control the gate 206 of the power transistor 202.

In some embodiments, the resistor 230 is designed to have a resistance that compensates the effect that the parasitic resistance (represented by the resistors 222 and 228) has on the $V_{GS}$ biasing of the power transistor 202. Let $R_{CHS}$ denote the channel resistance of the sense transistor 212 when on, and let $R_{CHM}$ denote the channel resistance of the power transistor 202 when on. Define the sense ratio SR as SR≡$I_P$/$I_S$, where $I_P$ is the drain-source current of the power transistor 202 when on, and $I_S$ is the drain-source current (i.e., the sense current) of the sense transistor 212 when on. If parasitic resistance is zero (or negligible), then SR=$R_{CHS}$/$R_{CHM}$. In general, the sense ratio depends upon the value of the parasitic resistance. Let $R_{COMP}$ denote the resistance of the resistor 230. With the controller 238 providing a virtual ground connection (zero voltage drop) from the second terminal 234 of the resistor 230 to the first terminal 208 of the power transistor 202, the sense ratio is given by $$SR = \frac{R_{CHS} + R_{COMP}}{R_{CHM} + R_{SUB2} + R_P}.$$

From the above expression for the sense ratio SR, designing the resistor 230 to have a resistance $R_{COMP}$ given by $$R_{COMP} = [R_P + R_{SUB2}]\frac{R_{CHS}}{R_{CHM}}$$

results in a sense ratio value of SR=$R_{CHS}$/$R_{CHM}$. Thus, the above choice for $R_{COMP}$ balances out the effect of the parasitic resistance upon the sense ratio. Accordingly, in some embodiments, the resistor 230 has a resistance matching a parasitic resistance multiplied by a ratio of the sense transistor channel resistance to the power transistor channel resistance. The parasitic resistance is the sum $R_P$+$R_{SUB2}$, i.e., that part of the total parasitic resistance of the power transistor 202 not shared with the sense transistor 212.

Matching the resistance $R_{COMP}$ of the resistor 230 to the quantity $$[R_P + R_{SUB2}]\frac{R_{CHS}}{R_{CHM}}$$

is not exact, and is performed with an accuracy commensurate with the technology available to one of ordinary skill in the relevant art. Furthermore, this matching will vary in accuracy over temperature. In some embodiments, the parasitic resistance $R_P$+$R_{SUB2}$ is estimated by simulation techniques. The ratio $R_{CHS}$/$R_{CHM}$ depends upon the ratio of the size of the power transistor 202 to the size of the sense transistor 212.

In some embodiments, the temperature coefficient of the resistor 230 is matched to the temperature coefficient of the parasitic resistance $R_P$+$R_{SUB2}$. Matching the temperature coefficients is facilitated by forming the resistor 230 on the semiconductor die 204 as a combination of serially-connected sections of metal and polysilicon. In some embodiments, the resistor 230 has a serpentine shape on the semiconductor die 204.

Figure 3:
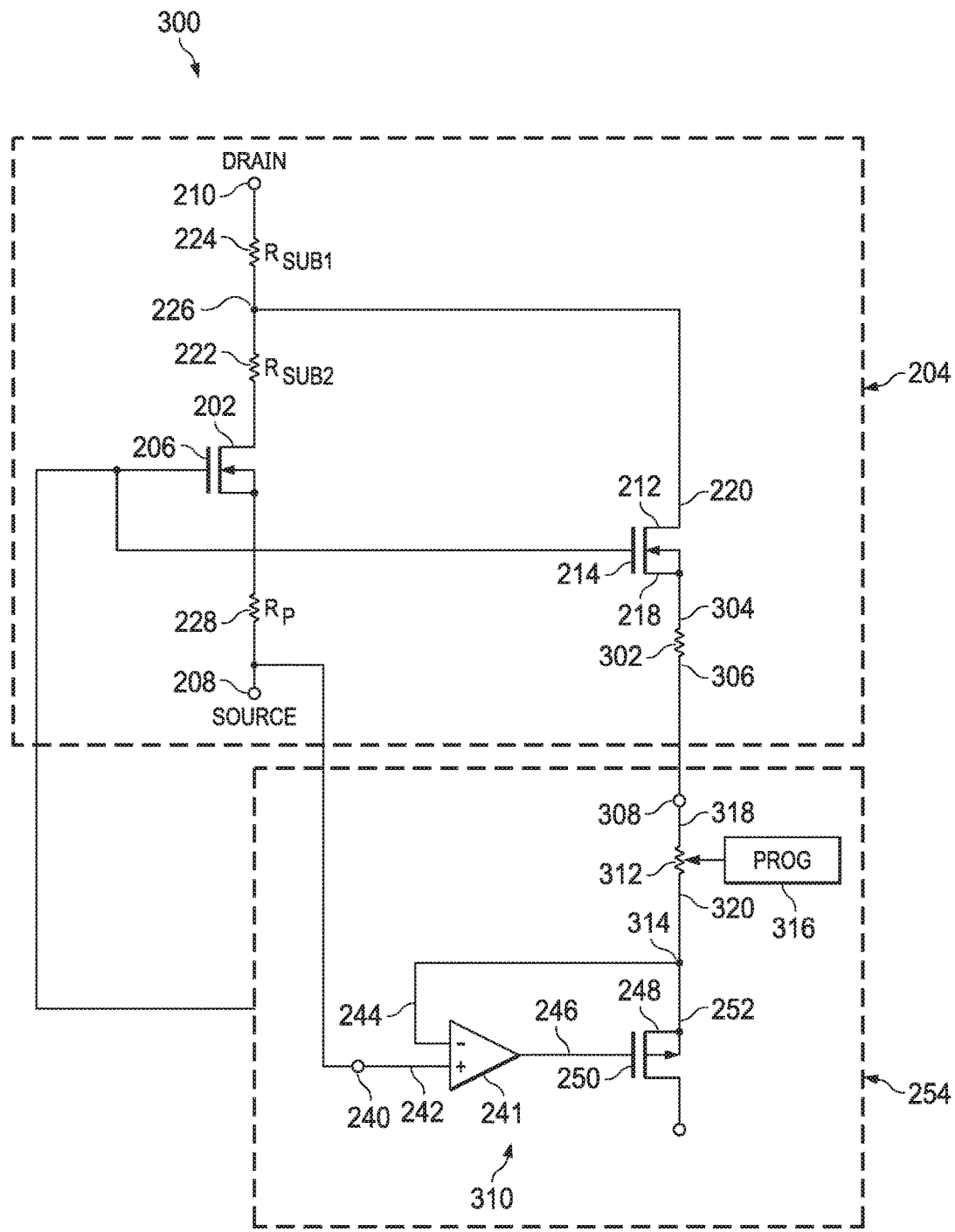
FIG. 3 shows a circuit of an electronic device in accordance with various examples.

FIG. 3 shows an illustrative electronic device 300. Corresponding components in FIG. 2 and FIG. 3 share the same numeric label. Shown in FIG. 3 is a first resistor 302 having a first terminal 304 coupled to the first terminal 218 of the sense transistor 212, and a second terminal 306 coupled to a first node 308 of a controller 310. The first resistor 302 can be similar in structure to the resistor 230 in FIG. 2. A second resistor 312 is coupled in series with the first resistor 302, where a first terminal 318 of the second resistor 312 is coupled to the first node 308, and a second terminal 320 of the second resistor 312 is coupled to the source 252 of the pass transistor 248.

The first resistor 302 is integrated in the semiconductor die 204, and the second resistor 312 is integrated in the semiconductor die 254. The controller 310 provides a virtual connection between an internal node 314 of the controller 310 (or equivalently, the second terminal 320 of the second resistor 312) and the first terminal 208 of the power transistor 202. Stated another way, the controller 310 maintains a first voltage at the internal node 314 (or equivalently, the second terminal 320 of the second resistor 312) to be equal to a second voltage of the first terminal 208. Let $R_{ZTC}$ denote the resistance of the second resistor 312. Designing the resistors 302 and 312 such that $$R_{COMP} + R_{ZTC} = [R_P + R_{SUB2}]\frac{R_{CHS}}{R_{CHM}},$$

results in a sense ratio value of SR=$R_{CHS}$/$R_{CHM}$.

In some embodiments, the second resistor 312 is a zero-temperature-coefficient (ZTC) resistor. In some embodiments, the controller 310 includes a memory 316 to store programming bits to program the resistance value $R_{ZTC}$ of the second resistor 312. Programming the resistance value $R_{ZTC}$, and designing the second resistor 312 as a ZTC resistor, provide additional degrees of freedom in matching the temperature coefficient of the first resistor 302 to the parasitic resistance of the power transistor 202 as well as matching the sum of resistances $$R_{COMP} + R_{ZTC} \text{ to } [R_P + R_{SUB2}]\left(\frac{R_{CHS}}{R_{CHM}}\right).$$

Based on simulation and silicon characterization, a resistance value of the second resistor 312 may be found to minimize sense ratio variation across temperature and $V_{GS}$. The pre-trim sense ratio is first measured, then, by using trim bits stored in the memory 316, the resistance of the second resistor 312 can be varied digitally to obtain the desired value of the measured sense ratio.

Figure 4:
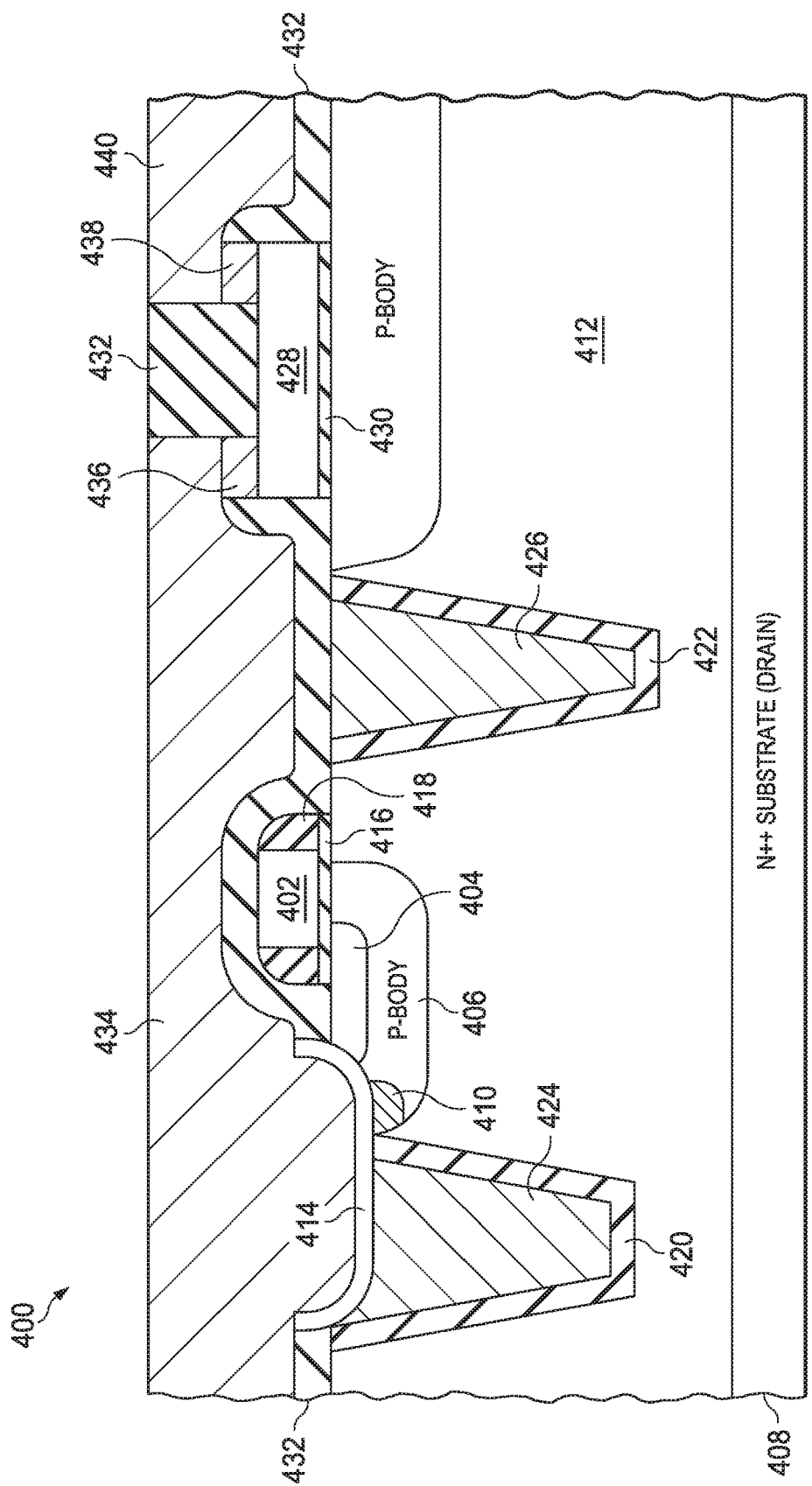
FIG. 4 shows a cross-sectional view of an electronic device in accordance with various examples.

FIG. 4 shows a simplified, cross-sectional view (not drawn to scale) of an illustrative electronic device 400. FIG. 4 illustrates a sense transistor comprising a gate 402, a source 404, a body 406, and a drain 408. The gate 402 comprises polysilicon, the source 404 is n-type, the body 406 is p-type, and the drain 408 is n-type. A p-type body contact 410 is formed in the body 406. An n-type epitaxial layer 412 is grown over the drain 408, where the source 404 and the body 406 are formed in the n-type epitaxial layer 412. A n-type region 414 is formed in contact with the source 404 and the body contact 410. A field oxide 416 is underneath the gate 402, where an oxide 418 serves as spacers for the gate 402. Trenches are formed to isolate the sense transistor in FIG. 4, illustrated by liner oxides 420 and 422, and polysilicon 424 and 426.

The sense transistor illustrated in FIG. 4 is a vertical nMOSFET. Embodiments are not limited to vertical transistors, and may include lateral transistors. In the embodiments illustrated in the drawings, the transistors 202 and 212 are nMOSFETs, and the pass transistor 248 is a p-metal-oxide-semiconductor field-effect-transistor (pMOSFET). For some embodiments, the transistors 202 and 212 can be pMOSFETs, where the first terminals 208 and 218 are drains of the transistors 202 and 212, respectively, and the second terminals 210 and 220 are sources of the transistors 202 and 212, respectively.

FIG. 4 does not show a power transistor, although a power transistor integrated with the sense transistor shares the drain 408. The gate 402 is coupled to the gate of the power transistor, but the particular slice illustrated in FIG. 4 does not show this connection. A polysilicon section 428 is formed over a field oxide 430. A dielectric (e.g., silicon dioxide) 432 is formed over the gate 402 and a portion of the polysilicon section 428. A metal section (e.g., aluminum) 434 is formed to contact the source 404 and the polysilicon section 428 by way of a tungsten plug 436, where the dielectric 432 insulates the metal section 434 and the polysilicon section 428 from other structures. A tungsten plug 438 couples the polysilicon 428 to a metal section 440. The metal section 434, the polysilicon section 428, and the metal section 440 (as well as the tungsten plugs 436 and 438) form part of the resistor connected to the source of the sense transistor, such as, for example, the resistor 230 of FIG. 2 or the first resistor 302 of FIG. 3. Multiple metal sections and polysilicon sections can be serially connected to form the resistor.

Figure 5:
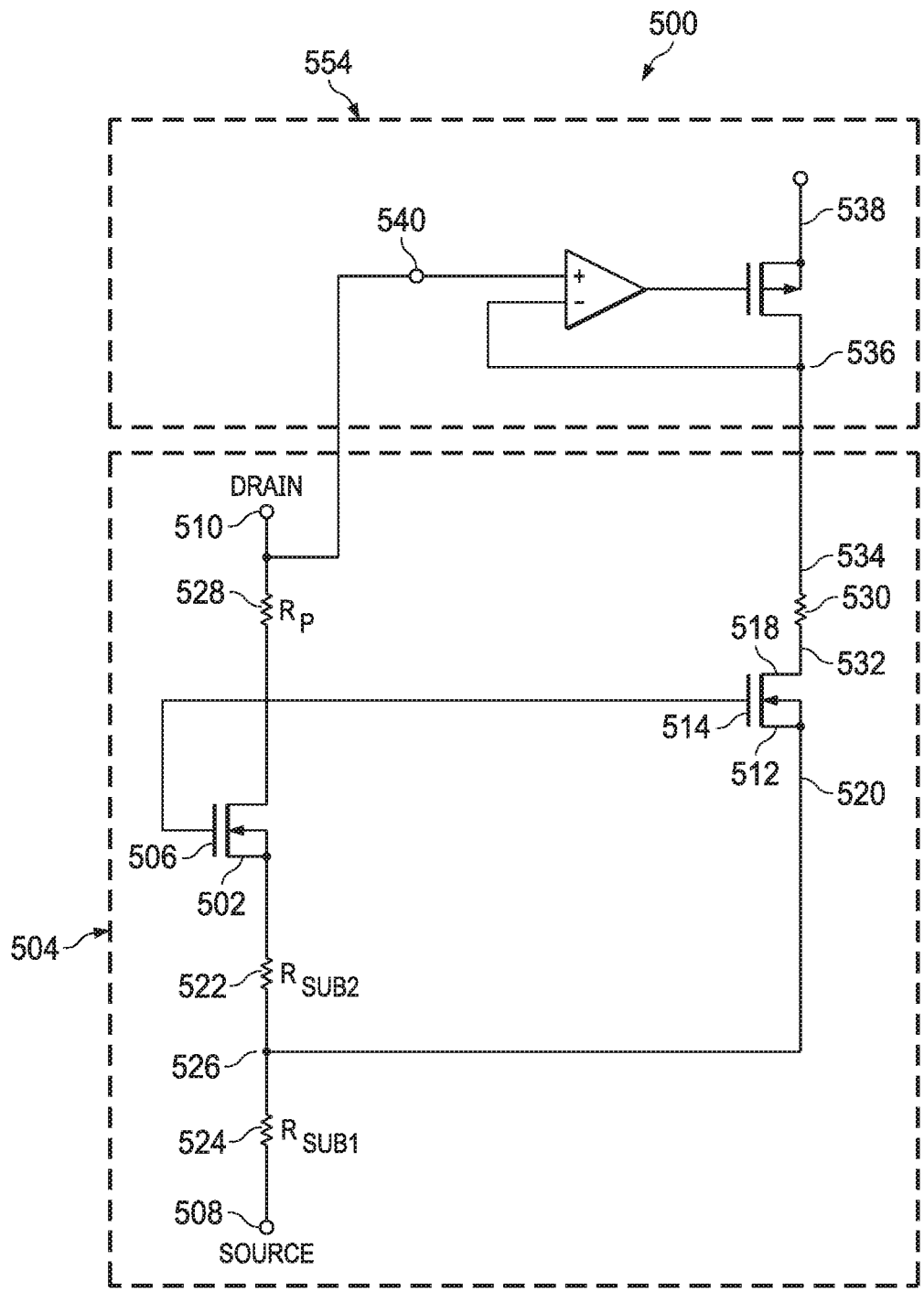
FIG. 5 shows a circuit of an electronic device in accordance with various examples.

FIG. 5 shows a circuit of an illustrative electronic device 500. A power transistor 502 and a sense transistor 512, each an nMOSFET, share a region of silicon that forms their first terminals in the semiconductor die 504, effectively coupling together their respective second terminals. This shared region of silicon can be referred to as a source region in the semiconductor die 204 for embodiments for which the first terminals denote sources of their respective transistors. The power transistor 502 is integrated on a semiconductor die 504, where the power transistor 502 comprises a gate 506, a first terminal 508, and a second terminal 510. In the embodiment of FIG. 5, the first terminal 508 is a source of the power transistor 502, and the second terminal 510 is a drain of the power transistor 502. Integrated on the semiconductor die 504 with the power transistor 502 is a sense transistor 512. The sense transistor 512 comprises a gate 514 coupled to the gate 506 of the power transistor 502, a first terminal 520 coupled to the first terminal 508 of the power transistor 502, and a second terminal 518. In the embodiment of FIG. 5, the first terminal 520 is a source of the sense transistor 512, and the second terminal 518 is a drain of the sense transistor 512.

A resistor 522 and a resistor 524 represent a parasitic (and distributed) resistance of the first terminal 508 of the power transistor 502. The circuit of FIG. 5 shows the first terminal 520 of the sense transistor 512 connected to a node 526, indicating that the resistor 524 represents a parasitic resistance in common with both the power transistor 502 and the sense transistor 512. A resistor 528 represents a parasitic resistance associated with the second terminal 510 of the power transistor 502.

A resistor 530 has a first terminal 532 coupled to the second terminal 518 of the sense transistor 512, and a second terminal 534 coupled to a first node 536 of a controller 538. The controller 538 includes a second node 540 coupled to the second terminal 510 of the power transistor 502.

The above description of the embodiment of FIG. 5 shows that the embodiment of FIG. 5 is similar to that of FIG. 2, but where the roles of their respective first and second terminals for the power and sense transistors are interchanged. Accordingly, the controller 538, integrated on a semiconductor die 554, provides a virtual connection from the resistor 530 to the second terminal 510 of the power transistor 502. The resistor 530 is similar to the resistor 230, and plays a corresponding role. The same resistance symbols displayed in FIG. 2 are re-used in FIG. 5, and the previous expressions relating these resistance values are applicable to the embodiment of FIG. 5 so as to provide a sense ratio value of $SR=R_{CHS}/R_{CHM}$.

As in the embodiment of FIG. 3, the embodiment of FIG. 5 may be modified so that the function of the resistor 530 is distributed among two resistors, a first resistor on the semiconductor die 504 corresponding to the first resistor 302, and a second resistor on the controller 538 (on the semiconductor die 554) corresponding to the second resistor 312, which may be programmable.

Accordingly, in the above description of the embodiments, the roles of the first and second terminals may be interchanged. For example, for embodiments comprising nMOSFET sense and power transistors, the "first terminal" of the sense and power transistors may refer to their respective sources, and the "second terminal" of the sense and power transistors may refer to their respective drains. Similarly, the "first terminal" of the sense and power transistors may refer to their respective drains, and the "second terminal" of the sense and power transistors may refer to their respective sources. Similar remarks are applicable to embodiments comprising pMOSFET sense and power transistors.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An electronic device comprising:
a first semiconductor die;
a power transistor integrated in the first semiconductor die, the power transistor comprising a gate, a first terminal, and a second terminal, the power transistor having a channel resistance and parasitic resistances;

a sense transistor integrated in the first semiconductor die, the sense transistor comprising a gate coupled to the gate of the power transistor, a first terminal, and a second terminal coupled to the second terminal of the power transistor, the sense transistor having a channel resistance; and a first resistor integrated in the first semiconductor die, the first resistor comprising a polysilicon section and a metal section coupled to the polysilicon section, the first resistor comprising a first terminal and a second terminal, wherein the first terminal of the first resistor is coupled to the first terminal of the sense transistor; the first resistor having a resistance matching the power transistor parasitic resistances multiplied by a ratio of the sense transistor channel resistance to the power transistor channel resistance.

2. The electronic device of claim 1, wherein
the first terminal of the power transistor is a source of the power transistor,
the second terminal of the power transistor is a drain of the power transistor,
the first terminal of the sense transistor is a source of the sense transistor, and
the second terminal of the sense transistor is a drain of the power transistor.

3. The electronic device of claim 2, wherein the power and sense transistors are each n-metal-oxide-semiconductor field-effect-transistors (nMOSFETs).

4. The electronic device of claim 2, wherein the power and sense transistors are each p-metal-oxide-semiconductor field-effect-transistors (pMOSFETs).

5. The electronic device of claim 1, wherein
the first terminal of the power transistor is a drain of the power transistor,
the second terminal of the power transistor is a source of the power transistor,
the first terminal of the sense transistor is a drain of the sense transistor, and
the second terminal of the sense transistor is a source of the power transistor.

6. The electronic device of claim 5, wherein the power and sense transistors are each n-metal-oxide-semiconductor field-effect-transistors (nMOSFETs).

7. The electronic device of claim 5, wherein the power and sense transistors are each p-metal-oxide-semiconductor field-effect-transistors (pMOSFETs).

8. The electronic device of claim 1, further comprising a controller, the controller comprising:
a first node coupled to the second terminal of the first resistor; and
a second node coupled to first terminal of the power transistor.

9. The electronic device of claim 8, further comprising:
a second semiconductor die, wherein the controller is integrated in the second semiconductor die.

10. The electronic device of claim 8, the controller to provide a virtual connection from the second terminal of the first resistor to the first terminal of the power transistor.

11. The electronic device of claim 8, the controller to maintain a first voltage at the first node to equal a second voltage at the second node.

12. The electronic device of claim 8, the controller further comprising:

an operational amplifier comprising a first input port coupled to the first terminal of the power transistor, a second input port coupled to the first resistor, and an output port; and
a pass transistor having a gate coupled to the output port of the operational amplifier, and a drain coupled to the first resistor.

13. The electronic device of claim 8, wherein the controller further comprises:
a second resistor comprising a first terminal coupled to the first node of the controller, and a second terminal;
the controller to provide a virtual connection from the second terminal of the second resistor to the first terminal of the power transistor.

14. The electronic device of claim 8, wherein the controller further comprises:
a second resistor comprising a first terminal coupled to the first node of the controller, and a second terminal;
the controller to maintain a first voltage at the second terminal of the second resistor to equal a second voltage at the second node.

15. The electronic device of claim 8, wherein the controller further comprises:
a second resistor comprising a first terminal coupled to the first node of the controller, and a second terminal;
an operational amplifier comprising a first input port coupled to the source of the power transistor, a second input port coupled to the second resistor, and an output port; and
a pass transistor having a gate coupled to the output port of the operational amplifier, and a drain coupled to the second resistor.

16. The electronic device of claim 8, wherein the controller further comprises:
a second resistor comprising a first terminal coupled to the first node of the controller, and a second terminal.

17. The electronic device of claim 8, wherein the controller further comprises:
a second resistor comprising a first terminal coupled to the first node of the controller, and a second terminal; and
a memory to store programming bits to program a resistance value of the second resistor.

18. An electronic device comprising:
a semiconductor die comprising a drain region;
a power transistor integrated in the semiconductor die, the power transistor comprising a gate and a source, the power transistor having a channel resistance and parasitic resistances;
a sense transistor integrated in the semiconductor die, the sense transistor comprising a gate coupled to the gate of the power transistor, and a source, wherein the power and sense transistors share the drain region, the sense transistor having a channel resistance; and
a resistor integrated in the semiconductor die, the resistor comprising a polysilicon section and a metal section coupled to the polysilicon section, the resistor coupled to the source of the sense transistor; the resistor having a resistance matching the power transistor parasitic resistances multiplied by a ratio of the sense transistor channel resistance to the power transistor channel resistance.

19. An electronic device comprising:
a semiconductor die comprising a source region;
a power transistor integrated in the semiconductor die, the power transistor comprising a gate and a drain, the power transistor having a channel resistance and parasitic resistances;

a sense transistor integrated in the semiconductor die, the sense transistor comprising a gate coupled to the gate of the power transistor, and a drain, wherein the power and sense transistors share the source region, the sense transistor having a channel resistance; and
a resistor integrated in the semiconductor die, the resistor comprising a polysilicon section and a metal section coupled to the polysilicon section, the resistor coupled to the drain of the sense transistor; the resistor having a resistance matching the power transistor parasitic resistances multiplied by a ratio of the sense transistor channel resistance to the power transistor channel resistance.

* * * * *